Figure 1:
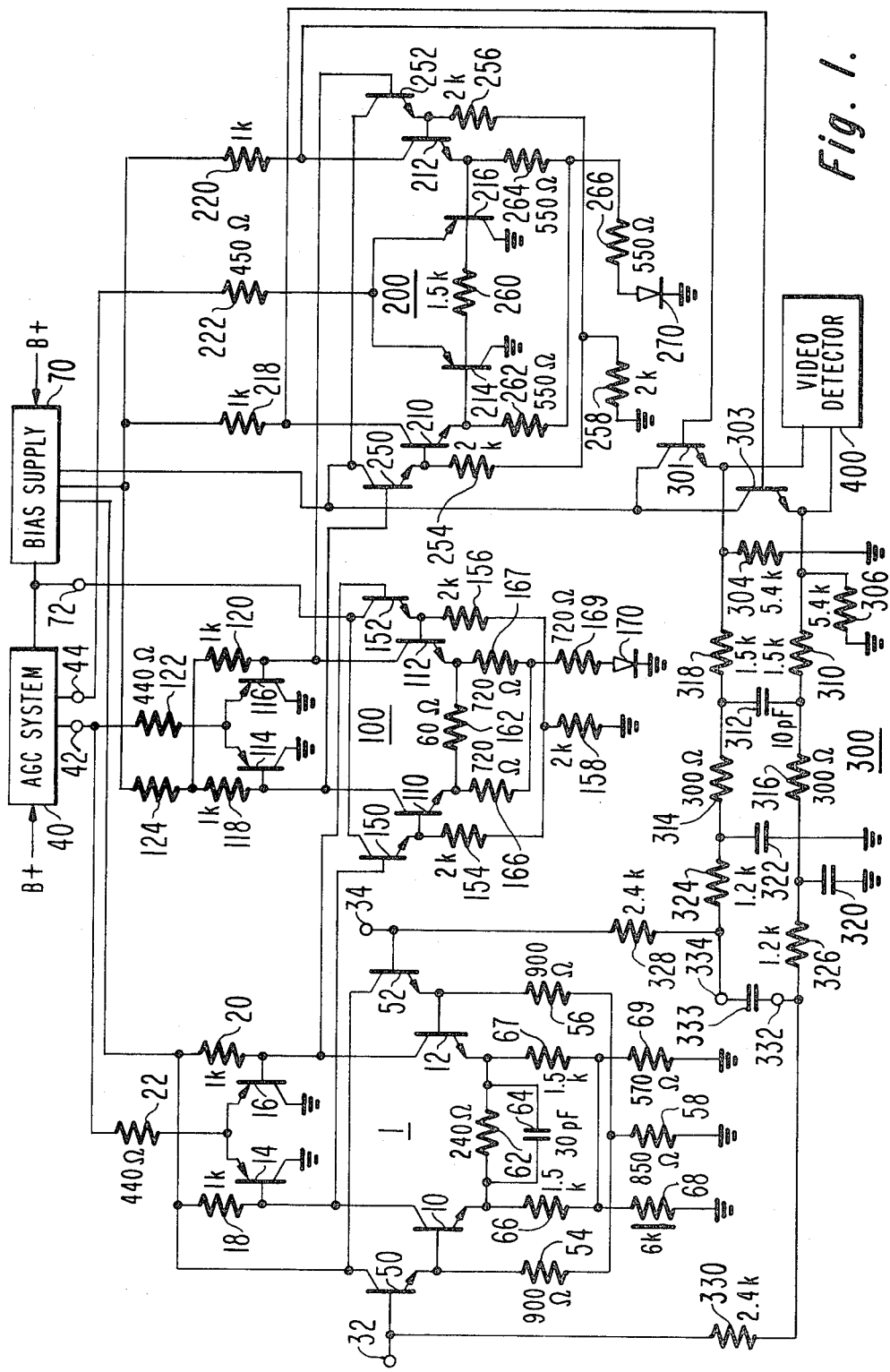

United States Patent [19]

Harford

[11] 4,366,443

[45] Dec. 28, 1982

[54] TELEVISION INTERMEDIATE FREQUENCY AMPLIFIER

[75] Inventor: Jack R. Harford, Flemington, N.J.

[73] Assignee: RCA Corporation, New York, N.Y.

[21] Appl. No.: 163,143

[22] Filed: Jun. 26, 1980

[51] Int. Cl.³ .............................................. H03G 3/30
[52] U.S. Cl. .................................... 330/254; 330/133;
330/259; 330/283; 330/284; 358/179
[58] Field of Search ............... 330/133, 254, 284, 283;
358/174, 175, 176, 177, 178, 179; 455/241, 249,
250, 251

[56] References Cited

U.S. PATENT DOCUMENTS

| | | | |
|---|---|---|---|
| 3,310,752 | 3/1967 | Horsthuber et al. | 330/291 |
| 3,331,028 | 7/1967 | Bay et al. | 330/284 X |
| 3,641,450 | 2/1972 | Lunn | 330/130 X |
| 4,139,824 | 2/1979 | Ohsawa | 330/254 |

*Primary Examiner*—James B. Mullins
*Attorney, Agent, or Firm*—Eugene M. Whitacre; Paul J. Rasmussen; Ronald H. Kurdyla

[57] ABSTRACT

An I.F. amplifier system is provided in which gain control is accomplished by varying the A.C. impedances of variable impedance devices, which devices are coupled as load and emitter degeneration impedances for amplifying transistors. Variable D.C. gain control currents are applied to the variable impedance devices to vary their impedance. When coupled as collector loads, gain control is achieved by varying the load lines of the amplifiers. When coupled as emitter impedances, gain control is achieved through variable emitter degeneration. These two techniques of gain control are employed in respective different amplifying stages, which reduces the maximum amount of gain control current required at any particular point in the gain control process, thereby reducing the power consumption of the system.

7 Claims, 2 Drawing Figures

TELEVISION INTERMEDIATE FREQUENCY AMPLIFIER

This invention relates to television intermediate frequency (I.F.) amplifiers and, in particular, to a multistage I.F. amplifier in which two techniques of gain control are advantageously combined to produce a high gain amplification system featuring minimum intermodulation and amplitude distortion and low power consumption.

In a conventional television I.F. amplifying section, several amplifier stages are usually cascaded to provide high amplification for the I.F. signal which is received from the tuner and mixer circuitry. Since the received I.F. signal may be of varying signal strength, one or more of the amplifier stages is generally gain controlled, so that the final I.F. amplifier stage will provide a substantially constant strength signal to the video detector.

However, as the gain of the gain controlled stage or stages is varied by the usual techniques of forward or reverse gain control, the operating points of the amplifier stages are unavoidably changed as the D.C. currents conducted by the amplifier stages change. These D.C. operating point shifts will be applied to subsequent stages in the amplifier when the amplifiers are direct current coupled to each other, which is the conventional technique currently in use. This will result in undesirable alteration of the operating points of the subsequent stages, as the changing D.C. currents are propagated through the cascaded amplifier stages. Furthermore, the D.C. currents will cause changes in the D.C. level of the amplified signal, which can adversely affect the operation of the video detector and the AGC system. It is therefore desirable for the I.F. amplifier to be gain controlled in a manner which avoids shifts in the operating points of the amplifying devices.

In accordance with the principles of the present invention, an I.F. amplifier is provided in which gain control is accomplished by varying the A.C. impedances of variable impedance devices, which devices are coupled as load and emitter degeneration impedances for amplifying transistors. Variable D.C. gain control currents are applied to the variable impedance devices to vary their impedance. Substantially all of the D.C. gain control currents flow through the variable impedance devices in current paths which are separate from the amplifying transistors, thereby avoiding significant variation of the operating points of the amplifying transistors. Since the operating points of the various stages are substantially unaffected during gain control, the individual stages may be designed to operate at optimum, substantially unvarying bias points.

The variable impedance devices which are used in the amplifier of the present invention may be coupled as either collector loads or emitter impedances for the amplifying transistors. When coupled as collector loads, gain control is achieved by varying the load lines of the amplifiers. When coupled as emitter impedances, gain control is achieved through variable emitter degeneration. To decrease the gain of a variable collector load amplifier stage, the gain control current being supplied to the variable impedance device is increased; to decrease the gain of an emitter degeneration amplifier stage, the gain control current being supplied to the variable impedance device is decreased. If only variable collector load stages are used, a maximum flow of gain control current would be required under the minimum gain condition; likewise, if only emitter degeneration stages are used, the gain control current would be at a maximum under the maximum gain condition. In accordance with another aspect of the present invention, these two techniques of gain control are employed in respective different amplifying stages, which reduces the maximum amount of gain control current required at any particular point in the gain control process, thereby reducing the power consumption of the system.

In a preferred embodiment of the present invention, three gain controlled stages are used in an I.F. amplifier. The first two stages employ variable collector load gain control, and the final stage employs controlled emitter degeneration. Since the variable impedance devices are coupled in the emitter circuit of the final amplifying stage, they will not introduce amplitude intermodulation distortion into the amplified signals, which could occur if they were coupled to the collector electrode of the third stage transistor, where high level signals are developed. The preferred embodiment also employs a sequence of gain reduction wherein the final stage variable impedance devices are cut off before the I.F. signal supplied by the first and second stages has reached its maximum amplitude, thereby further ensuring that the final stage devices will introduce no distortion into the amplified signal under large signal conditions.

Figure 2:
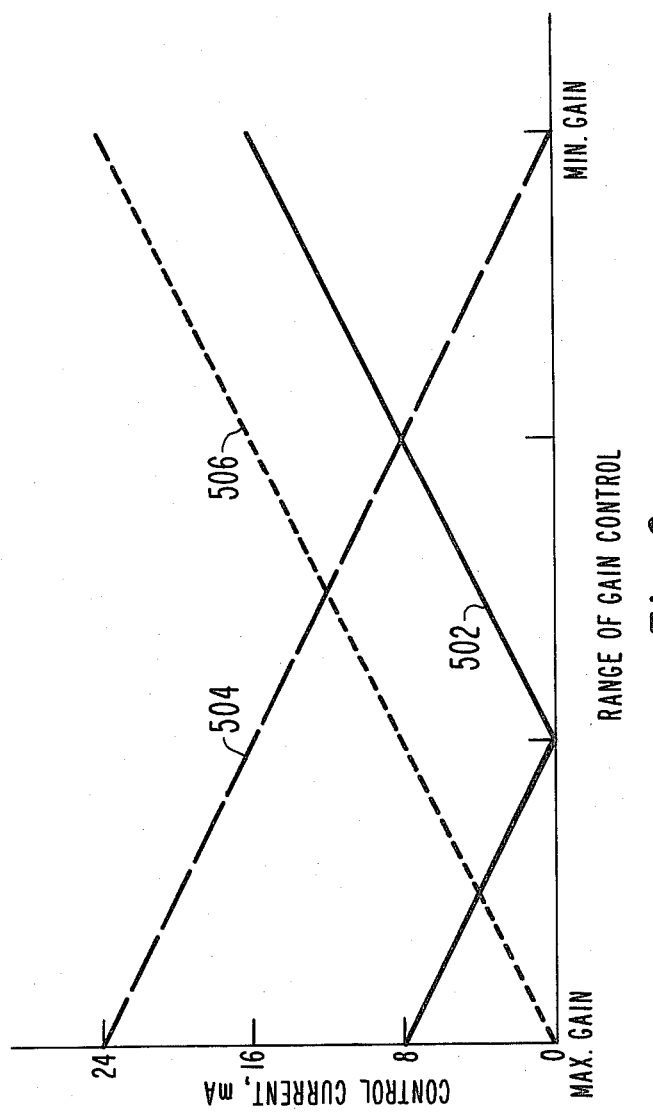

In the drawings:

FIG. 1 illustrates in schematic and block diagram form a three stage I.F. amplifier constructed in accordance with the principles of the present invention; and FIG. 2 illustrates gain control current requirements of the arrangement of FIG. 1.

Referring to FIG. 1, three differential I.F. amplifier stages 1, 100 and 200 are coupled in cascade, with a feedback path 300 coupled between the third and first stages 200 and 1. The three stages are gain controlled by control currents supplied by an AGC system 40, and bias voltages for the system is provided by a bias supply 70.

A push-pull video I.F. signal is applied across input terminals 32 and 34, which are coupled to the bases of buffer transistors 50 and 52 of the first stage 1. The collectors of the buffer transistors 50 and 52 are coupled to the bias supply 70, and their respective emitter electrodes are coupled to the bases of amplifying transistors 10 and 12. Biasing for the emitter-base connections of transistors 50 and 10, and 52 and 12, is provided by resistors 54, 56 and 58. A D.C. ground return path for the emitters of transistors 10 and 12 is provided by resistors 66, 67 and 69, and pinch resistor 68. The pinch resistor 68 is also used to stabilize beta variations in the transistors of the first stage, which variations may occur from one circuit to another during volume production of the amplifier in integrated circuit form.

The A.C. emitter impedance of transistors 10 and 12 is dominated by a resistor 62 and a peaking capacitor 64, which are coupled in parallel between the emitters of the transistors. Each amplifying transistor 10 or 12 has a load impedance comprising a resistor 18 or 20 coupled between the collector of the respective transistor and the bias supply 70, and a variable impedance device. The collector of transistor 10 is coupled to the base of a variable impedance device 14, and the collector of transistor 12 is coupled to the base of a variable impedance device 16. The variable impedance devices 14 and 16 have collectors which are coupled to a reference potential (ground) and joined emitters, which are coupled to receive control current from the AGC system 40 by way of a resistor 22.

The output signals at the collectors of the amplifying transistors 10 and 12 are direct current coupled to the bases of buffer transistors 150 and 152 of the second amplifying stage 100. The second amplifying stage 100 is constructed in a similar manner as the first amplifying stage 1, and respective similar circuit elements have reference numerals which are increased by one hundred as compared with their counterparts in the first stage. The second stage 100 differs from the first stage in that it does not include a peaking capacitor or a pinch resistor. A forward biased diode 170 is coupled between the emitter resistor 169 and ground. This diode cooperates with the amplifying and buffer transistors in the second stage to provide the collectors of transistors 10 and 12 with a 3 $V_{be}$ D.C. term for bias and temperature stabilization purposes. It may be seen that the collector of transistor 10 is D.C. biased by the base-emitter junctions of transistors 150 and 110, and the junction of diode 170. Similarly, the collector of transistor 12 is D.C. biased by the base-emitter junctions of transistors 152 and 112, and the junction of diode 170.

The construction and operation of the first and second amplifying stages 1 and 100 is described in detail in my copending U.S. patent application Ser. No. 143,032, now U.S. Pat. No. 4,344,043 entitled "VARIABLE LOAD IMPEDANCE GAIN-CONTROLLED AMPLIFIER," filed Apr. 23, 1980, the subject matter of which is incorporated by reference. There it is explained that the gain of the amplifying stages is varied by varying the voltage and hence the current supplied to the variable impedance devices 14, 16 and 114, 116. Under maximum gain conditions, little or no current is supplied to the devices, and their base-to-emitter A.C. impedance is relatively high. The device impedance is in parallel with a respective collector load resistor 18, 20, 118 or 120, which combined impedance determines the load line of the amplifier. As the I.F. signal supplied to the amplifiers increases in amplitude, the current supplied to the variable impedance devices by the AGC system 40 also increases. This causes the base-to-emitter impedance of the devices to decrease, as charge is stored in the base-emitter regions of the devices. The decreased impedance of the devices reduces the collector impedance of the amplifying transistors 10, 12, 110, 112, which shifts their load lines to a lower gain condition. When the amplifying stages are in a full gain-reduced condition, the current supplied to the variable impedance devices is at a maximum value, which is of the order of several milliamperes. The primary current paths for the current supplied by the AGC system 40 is through the emitter-to-collector paths of the variable impedance devices 14, 16, 114 and 116. Thus, substantially no D.C. gain control current from the AGC system flows in the collectors of the amplifying transistors 10, 12, 110 and 112. The D.C. biasing of the amplifying transistors is therefore substantially constant as the ranges of gain control of the amplifying stages are traversed.

The collectors of the second stage amplifying transistors 110 and 112 are respectively direct current coupled to the bases of buffer transistors 250 and 252 of the third amplifying stage 200. The collectors of buffer transistors 250 and 252 are coupled to receive bias voltage from the bias supply 70, and their emitters are returned to ground by resistors 254, 256 and 258. The emitters of buffer transistors 250 and 252 are also coupled to the bases of amplifying transistors 210 and 212, respectively.

The collectors of the amplifying transistors 210 and 212 are coupled to the bias supply 70 by way of respective load resistors 218 and 220. The emitters of the amplifying transistors 210 and 212 are returned to ground through resistors 262, 264 and 266. A forward biased diode 270 is coupled between resistor 266 and ground. Diode 270 performs a similar function as that of diode 170, as it cooperates with the buffer and amplifying transistors 250, 252, 210 and 212 to provide the collectors of the second stage amplifying transistors 110 and 112 with a quiescent D.C. voltage term of 3 $V_{be}$.

A resistor 260 is coupled between the emitters of transistors 210 and 212. The emitters of transistors 210 and 212 are also coupled to the bases of respective variable impedance devices 214 and 216. The collectors of the variable impedance devices 214 and 216 are coupled to ground, and their emitters are coupled to receive gain control current from AGC system 40 by way of a resistor 222.

The third amplifying stage 200 is constructed and operates in a similar manner as the amplifier described in my copending U.S. patent application No. 143,035, entitled "VARIABLE EMITTER DEGENERATION GAIN-CONTROLLED AMPLIFIER," filed Apr. 23, 1980 which is incorporated by reference. Briefly, the emitter resistance of each amplifying transistor includes one-half of the value of resistor 260 (due to the complementary operation of the amplifying transistors in response to push-pull I.F. signals), in parallel with the base-to-emitter impedance of a variable impedance device and a further bias resistor. The variable impedance devices 214 and 216 may be constructed in the same manner as variable impedance devices 14, 16, 114 and 116, and are characterized by a base-to-emitter A.C. impedance which decreases as the current supplied to them by the AGC system 40 increases. For the maximum gain condition of the third amplifying stage 200, the current supplied to the variable impedance devices is at a maximum. This provides a low emitter impedance to the amplifying transistors 214 and 216, causing a relatively low level of emitter degeneration. As the gain control range of the amplifier is traversed toward its minimum gain condition, the current supplied to the variable impedance devices is decreased, which increases the A.C. impedance presented to the amplifying transistors by the devices. The emitter degeneration is increased and hence the gain of the amplifier is reduced. As in the case of the variable impedance devices described previously, the primary current path for the control current supplied by the AGC system 40 is through the emitter-to-collector paths of devices 214 and 216, which minimizes changes in the D.C. biasing of the amplifying transistors 210 and 212 as the gain control range of the amplifier is traversed.

An amplified I.F. signal is developed across the collector load resistors 218 and 220, and is applied to a video detector 400 from the collectors of transistors 210 and 212 by way of transistors 301 and 303. Transistors 301 and 303 are coupled in emitter follower configurations, with their collectors coupled to receive a supply potential from bias supply 70, and their emitters coupled to ground by respective resistors 304 and 306. These transistors buffer the load resistors 218 and 220 of the third amplifying stage 200 from the input impedance of the video detector, and provide a low impedance drive at their emitters. The emitters of transistors 301 and 303 are also coupled to the feedback path 300. Transistors 301 and 303 provide a quiescent D.C. voltage term at the collectors of transistors 210 and 212 of 3 $V_{be}$, in combination with first stage transistors 10, 50, 12 and 52 and the feedback path 300.

The feedback path 300 is comprised of two D.C. paths, one for each side of the balanced amplifier configuration. A feedback path including serially coupled resistors 318, 314, 324 and 328 is coupled between the emitter of transistor 301 and the base of first stage transistor 52. A second feedback path including serially coupled resistors 310, 316, 326 and 330 is coupled between the emitter of transistor 303 and the base of transistor 50.

The feedback path 300 includes two decoupling networks which decouple the amplified output I.F. signals from the input of stage 1. A first decoupling network includes buffer resistors 310 and 318 and a capacitor 312, and the second decoupling network includes buffer resistors 314 and 316, and bypass capacitors 322 and 320. Resistors 310 and 318 isolate the output at the emitters of transistors 301 and 303 from capacitor 312. The capacitor 312 is coupled across the two D.C. paths to significantly attenuate the complementary I.F. signals which are produced on the two paths. Any remaining I.F. signal components which appear on the two plates of capacitor 312 are then applied to bypass capacitors 322 and 320 by buffer resistors 314 and 316, respectively. The bypass capacitors 322 and 320 will then shunt any remaining I.F. signal components to ground. The decoupling networks act as low pass filters for the I.F. signals, with breakpoints below the desired range of I.F. signals, so that substantially only D.C. signals are applied to buffer resistors 324 and 326. The values of the resistors are chosen so that the D.C. feedback signals are not attenuated beyond a level at which they will provide the desired amount of feedback compensation in the first stage 1.

Buffer resistors 324 and 326 are coupled to the input transistors 52 and 50 by way of terminals 334 and 332 and isolation resistors 328 and 330, respectively. A further bypass capacitor 333 is coupled between terminals 332 and 334. The isolation resistors 328 and 330 serve to isolate the inputs to the first amplifying stage 1 from bypass capacitor 333. The bypass capacitor 333, together with resistors 324, 314 318 and 326, 316, 310 determine the unity gain point of the I.F. amplifier and feedback loop, to assure system stability. The feedback loop is described in greater detail in my copending U.S. patent application No. 163,144, now U.S. Pat. No. 4,342,005, entitled "TELEVISION INTERMEDIATE FREQUENCY AMPLIFIER WITH FEEDBACK STABILIZATION," concurrently filed herewith.

Unlike some prior art I.F. amplifier systems, the I.F. amplifier of the present invention does not require an additional amplifier in the feedback path 300. This additional amplifier was needed in the prior art arrangements because those arrangements are characterized by low D.C. gain due to the exclusive use of emitter degeneration type amplifying stages. As the gain of those stages is reduced, the D.C. gain is also reduced, and hence the additional amplifier is required to amplify the D.C. feedback signal. Of the three amplifying stages of the present invention, only the third stage uses emitter degeneration gain control. The third stage D.C. gain is dominated by the emitter resistors 260, 262, and 264, which gives the third stage a high input impedance and a low frequency gain of approximately 10 db. The first and second amplifying stages, which rely upon load line variation for gain control, have respective D.C. gains of approximately 20 db. The D.C. gain of the three cascaded stages is fairly constant over the full range of gain control, and has been found to vary by no more than 6 db over the full range. This stability in D.C. gain is attributed to the nonvarying D.C. biasing of the amplifying stages, as a result of the use of variable impedance devices, the control of which does not substantially affect the D.C. biasing of the amplifying transistors.

The use of collector-controlled variable load line gain control in the first two amplifying stages and controlled emitter degeneration in the third stage reduces the maximum amount of current required for gain control and therefore the power dissipation in the I.F. amplifier system of the present invention. Control current is supplied to the variable impedance devices of the first two stages by way of a common terminal 42 of the AGC system 40. The gain of these two stages is reduced by increasing the flow of control current. Control current is supplied to the variable impedance devices of the third stage by way of a separate terminal 44. The gain of this stage is reduced by decreasing the flow of control current from the AGC system 40 to the third stage.

An example of the control current efficiency of the I.F. amplifier system of the present invention is shown in FIG. 2, in which the solid line 502 represents the magnitude of control current over the gain control range of the system of FIG. 1, dashed line 504 represents the magnitude of control current required by the completely emitter degeneration controlled system of the prior art, and dotted line 506 represents the magnitude of control current required by an all-collector controlled load line variation gain controlled I.F. amplifier. For purposes of the present example, it will be assumed that the amplifier is to be gain reduced from maximum gain to minimum gain, and that the third stage is to be gain reduced first, after which the gains of the first and second stages will be simultaneously reduced.

If all three amplifying stages were to be constructed as in the prior art emitter degeneration arrangement, or using the controlled emitter degeneration stage as illustrated by the third stage 200, all three stages would simultaneously require maximum gain control current under the maximum gain condition, which, for illustration purposes in FIG. 2, is assumed to be 8 ma. per stage, for a total of 24 ma. As the range of gain control is traversed to the minimum gain condition, the control current flow decreases from 24 ma. to zero ma., as shown by dashed line 504. Similarly, if all three stages were constructed in the manner of stages 1 and 100, using collector-coupled controlled impedance devices, no control current would be needed for maximum gain operation, and a full 24 ma. would be required for the minimum gain condition.

But in the configuration shown in FIG. 1, the collector-controlled stages require no gain control current and the third stage requires its maximum of 8 ma. under the maximum gain condition. As gain reduction proceeds, the control current supplied to the third stage decreases to zero during the initial portion of the gain reduction process. When the third stage is fully gain reduced, the AGC system is supplying no control current to the amplifier. During the latter portion of the gain reduction process, current is increasingly applied to the first and second stages as their ranges of gain control are traversed toward the minimum gain condition. Finally, at the minimum system gain condition, the first and second stages are sharing 16 ma. of control current. It may be seen that at no time is the demand for control current any greater than 16 ma., which is an improvement over the 24 ma. maximum requirement of the other configurations.

The control current line 502 is seen to change direction at the point at which the current being supplied to the third stage reaches zero, and current flow to the first and second stages commences. This requires precise control of the AGC system, to assure that the transition from third to first and second stage gain control occurs without any discontinuity in the control sequence. However, such precision is not easy to attain in an actual embodiment of the arrangement of FIG. 1. Accordingly, in a preferred embodiment of the present invention, the control current to the third stage is reduced to approximately 4 ma., at which point control current begins to flow to the first and second stages. This assures a smooth transition of gain control from the third to the first and second stages. Thereafter, control current to the third stage is reduced to zero and current is increasingly supplied to the first and second stages. The control current to the first and second stages attains its maximum value of 16 ma. under the minimum gain condition.

It may be appreciated that the sequence of gain reduction employed in the arrangement of FIG. 1 need not be the same as that illustrated by the above example. For instance, the amplifying stages may be simultaneously gain controlled, or gain controlled in any other desirable sequence. Moreover, the stages may be collector or emitter gain controlled in a sequence other than that shown in FIG. 1, in which the first and second stages are collector controlled, and the third stage is emitter controlled. However, the arrangement of FIG. 1 is a preferred embodiment, in that the first stage is collector controlled and the third stage is emitter controlled. By coupling the variable impedance devices as collector loads in the first stage, the input impedance of the first stage remains substantially constant over the range of gain control. This is important because the stable input impedance will not cause any mistuning of previous selectivity circuitry in the television receiver, which mistuning could result from the use of controlled emitter degeneration in the first amplifying stage. Furthermore, the highest level amplified I.F. signals are developed at the collectors of the third stage amplifying transistors 210 and 212. If the variable impedance devices were coupled in the collector circuits of these transistors instead of the emitter circuits, the application of the high level I.F. signals to the devices could introduce intermodulation distortion into the output signals. This is prevented by the use of the devices for controlled emitter degeneration in the third amplifying stage 200. Finally, by gain reducing the third stage first as in the example described in conjunction with FIG. 2, variable impedance devices 214 and 216 are turned off at a time when the level of the signals applied to the third stage from the second stage is still low. Thus, under strong signal conditions, when intermodulation distortion is most likely to occur, devices 214 and 216 are completely turned off, eliminating the subsequent possibility that control of these devices will introduce intermodulation distortion into the system.

What is claimed is:

1. A television intermediate frequency amplifying system comprising:
    a first amplifying stage having a signal input and a signal output, and including a first amplifying transistor coupled in a common emitter configuration, a first resistor coupled between the collector of said first transistor and a source of supply potential and passing a first direct current therebetween, and means coupled in shunt with said first resistor and responsive to variations of a first gain control current for causing gain variations for said first amplifying stage opposite in sense as said first gain control current variations with negligible disturbance of the magnitude of said first direct current; and
    a second amplifying stage having a signal input coupled to the signal output of said first amplifying stage, and including a second amplifying transistor coupled in a common emitter configuration, a second resistor coupled between said emitter of said second transistor and a point of signal reference potential and passing a second direct current therebetween, and means coupled in shunt with said second resistor and responsive to variations of a second gain control current for causing gain variations for said second amplifying stage of the same sense as said second gain control current variations with negligible disturbance of the magnitude of said second direct current.

2. A television intermediate frequency amplifying system comprising:
    a plurality of gain controlled amplifying stages coupled in cascade, said stages including
        a first stage having a first amplifying transistor coupled in a common emitter amplifier configuration with a load impedance coupled in the collector circuit thereof, and a first variable impedance transistor having a base coupled to the collector of said first amplifying transistor and a base-to-emitter junction exhibiting an impedance effectively in shunt with said load impedance which varies as a function of a control current applied to the emitter of said first variable impedance transistor;
        a second stage having a second amplifying transistor coupled in a common emitter amplifier configuration and a second variable impedance transistor having a base coupled to the emitter of said second amplifying transistor and a base-to-emitter junction exhibiting an impedance which varies as a function of a control current applied to the emitter of said second variable impedance transistor; and
    a source of variable control current, including a first controlled current path coupled to the emitter of said first variable impedance transistor, and a second controlled current path coupled to the emitter of said second variable impedance transistor,
    wherein the gain of said first stage decreases with increasing current flow in said first controlled current path, and the gain of said second stage increases with increasing current flow in said second controlled current path.

3. A television intermediate frequency amplifying system comprising:
    a plurality of gain controlled amplifying stages coupled in cascade, said stages including
        a first stage having a first amplifying transistor coupled in a common emitter amplifier configuration with a load impedance coupled in the collector circuit thereof, and a first variable impedance transistor having a base coupled to the collector of said first amplifying transistor and a base-to-emitter junction exhibiting an impedance effectively in shunt with said load impedance which varies as a function of a control current applied to the emitter of said first variable impedance transistor;

a second stage having a second amplifying transistor coupled in a common emitter amplifier configuration and a second variable impedance transistor having a base coupled to the emitter of said second amplifying transistor and a base-to-emitter junction exhibiting an impedance which varies as a function of a control current applied to the emitter of said second variable impedance transistor;

a source of variable control current, including a first controlled current path coupled to the emitter of said first variable impedance transistor, and a second controlled current path coupled to the emitter of said second variable impedance transistor, wherein the gain of said first stage decreases with increasing current flow in said first controlled current path, and the gain of said second stage increases with increasing current flow in said second controlled current path; and a third gain controlled amplifying stage having a third amplifying transistor coupled in a common emitter configuration, the base of said third amplifying transistor being direct current coupled to the collector of said first amplifying transistor, and the collector of said third amplifying transistor being direct current coupled to the base of said second amplifying transistor, and a third variable impedance transistor having a base coupled to the collector of said third amplifying transistor and a base-to-emitter junction exhibiting an impedance which varies as a function of the control current applied to the emitter of said third variable impedance transistor, wherein said source of variable control current further includes a third controlled current path coupled to the emitter of said third variable impedance transistor, wherein the gain of said third stage decreases with increasing current flow in said third controlled current path.

4. The television intermediate frequency amplifying system of claim 3, wherein said first stage further includes a fourth amplifying transistor coupled in a differential amplifier configuration with said first amplifying transistor, with a load impedance coupled in the collector circuit of said fourth amplifying transistor, and a fourth variable impedance transistor having a base coupled to the collector of said fourth amplifying transistor, and an emitter coupled to the emitter of said first variable impedance transistor;

said second stage further includes a fifth amplifying transistor coupled in a differential amplifier configuration with said second amplifying transistor, and a fifth variable impedance transistor having a base coupled to the emitter of said fifth amplifying transistor and an emitter coupled to the emitter of said second variable impedance transistor; and said third stage further includes a sixth amplifying transistor coupled in a differential amplifier configuration with said third amplifying transistor, the base of said sixth amplifying transistor being direct current coupled to the collector of said fourth amplifying transistor and the collector of said sixth amplifying transistor being direct current coupled to the base of said fifth amplifying transistor, and a sixth variable impedance transistor having a base coupled to the collector of said sixth amplifying transistor and an emitter coupled to the emitter of said third variable impedance transistor, wherein the base-to-emitter junctions of each of said fourth, fifth and sixth variable impedance transistors exhibits an impedance which varies as a function of the control current applied to the respective emitter of said fourth, fifth and sixth variable impedance transistors.

5. The television intermediate frequency amplifying system of claim 3 or 4, wherein said variable control current source includes means for minimizing the current flow in said first and third controlled current paths during a high gain condition of said amplifying system, and means for minimizing the current flow in said second controlled current path during a low gain condition of said amplifying system.

6. The television intermediate frequency amplifying system of claim 3 or 4, wherein said variable control current source further includes means for decreasing the current flow in said second controlled current path to decrease the gain of said system from a high gain condition to an intermediate gain condition; and means for increasing the current flow in said first and third controlled current paths to decrease the gain of said system from said intermediate gain condition to a low gain condition.

7. A television intermediate frequency amplifying system comprising:

a first amplifying stage including a first amplifying transistor coupled in a common emitter configuration, a first resistor coupled between said collector of said first transistor and a source of supply potential and passing a first direct current therebetween, means coupled in shunt with said first resistor and responsive to variations of a first gain control current for causing gain variations for said first amplifying stage opposite in sense as said first gain control current variations with negligible disturbance of the magnitude of said first direct current, and an emitter impedance which is substantially unvarying in response to variations in any gain control current, said emitter impedance being the exclusive emitter impedance of said first transistor; and a second amplifying stage coupled in cascade with said first amplifying stage, and including a second amplifying transistor coupled in a common emitter configuration, a second resistor coupled between said emitter of said second transistor and a point of signal reference potential and passing a second direct current therebetween, and means coupled in shunt with said second resistor and responsive to variations of a second gain control current for causing gain variations for said second amplifying stage of the same sense as said second gain control current variations with negligible disturbance of the magnitude of said second direct current.

* * * * *